United States Patent
Uesaka et al.

(10) Patent No.: US 6,697,744 B2
(45) Date of Patent: Feb. 24, 2004

(54) INQUIRY METHOD OF THE SOURCE WHICH GENERATES ELECTROMAGNETIC WAVE

(75) Inventors: Kouichi Uesaka, Kawasaki (JP); Takashi Suga, Yokohama (JP)

(73) Assignee: Hitachi, Ltd., Tokyo (JP)

(*) Notice: Subject to any disclaimer, the term of this patent is extended or adjusted under 35 U.S.C. 154(b) by 103 days.

(21) Appl. No.: 09/932,420

(22) Filed: Aug. 17, 2001

(65) Prior Publication Data

US 2002/0158640 A1 Oct. 31, 2002

(30) Foreign Application Priority Data

Mar. 16, 2001 (JP) .......................... 2001-075364

(51) Int. Cl.[7] .......................... G06F 19/00; G01R 27/28
(52) U.S. Cl. .......................... 702/57; 324/627
(58) Field of Search .......................... 324/638, 529, 324/530, 765, 750, 627, 628, 637, 639, 642; 343/703; 702/57

(56) References Cited

U.S. PATENT DOCUMENTS

| | | | |
|---|---|---|---|
| 4,052,666 A | * | 10/1977 | Fletcher et al. .............. 324/643 |
| 5,650,935 A | | 7/1997 | Nishino et al. |
| 6,281,697 B1 | * | 8/2001 | Masuda et al. .............. 324/765 |
| 6,289,290 B1 | * | 9/2001 | Lee et al. ...................... 702/57 |
| 6,411,104 B1 | | 6/2002 | Uesaka et al. |

FOREIGN PATENT DOCUMENTS

WO   WO 00/65362   11/2000

* cited by examiner

Primary Examiner—John E. Chapman
Assistant Examiner—James Kerveros
(74) Attorney, Agent, or Firm—Townsend and Townsend and Crew LLP

(57) ABSTRACT

The electromagnetic-wave-generating-source search method includes the steps of calculating a first electric field strength at a measuring point based on a current distribution belonging to an object to be measured; calculating a second electric field strength at said measuring point by employing the current distribution at a preselected position on said measuring object, the preselected position corresponding to a portion of the current distribution of said measuring object; and calculating a relative ratio of said first electric field strength with respect to said second electric field strength, thereby determining the source generating a remote electric field.

7 Claims, 12 Drawing Sheets

FIG. 7 x DIRECTION

| Hx[dB] | 0 | 1 | 2 | 3 | 4 | ... | 30 |
|---|---|---|---|---|---|---|---|
| 0 | 28.47 | 29.13 | 29.76 | 30.35 | 30.88 | ... | 27.62 |
| 1 | 29.32 | 30.05 | 30.75 | 31.4 | 32 | ... | 28.38 |
| 2 | 3019 | 31 | 31.77 | 32.51 | 33.18 | ... | 29.17 |
| 3 | 31.09 | 31.98 | 32.84 | 33.67 | 34.44 | ... | 29.96 |
| 4 | 32 | 32.99 | 33.96 | 34.9 | 35.78 | ... | 30.76 |
| ... | ... | ... | ... | ... | ... | ... | ... |
| 20 | 28.75 | 29.44 | 30.09 | 30.69 | 31.25 | ... | 27.87 | y DIRECTION

FIG. 8 x DIRECTION

| Ix [mA] | 0 | 1 | 2 | 3 | 4 | ... | 30 |
|---|---|---|---|---|---|---|---|
| 0 | 0 | 0 | 0 | 0 | 0 | ... | 0 |
| 1 | 0 | 0.5 | 18.4 | 2.1 | 0 | ... | 0 |
| 2 | 0 | 13.1 | 25.9 | 8.3 | 5.0 | ... | 0 |
| 3 | 0.2 | 16.2 | 31.5 | 13.2 | 8.0 | ... | 0 |
| 4 | 11.3 | 18.0 | 36.0 | 17.3 | 10.2 | ... | 0 |
| ... | ... | ... | ... | ... | ... | ... | ... |
| 20 | 0 | 0 | 0 | 0 | 0 | ... | 0 | y DIRECTION

FIG. 9

| ANGLE | $E\phi$ | $E\theta xz$ | $E\theta yz$ |
|---|---|---|---|
| 0 | 48.73 | 46.35 | 48.70 |
| 5 | 48.69 | 45.55 | 48.67 |
| 10 | 48.59 | 45.43 | 48.56 |
| 15 | 48.42 | 44.32 | 48.39 |
| 20 | 48.17 | 42.23 | 48.15 |
| 25 | 47.85 | 42.10 | 47.83 |
| 30 | 47.45 | 42.34 | 47.44 |
| 35 | 46.96 | 43.30 | 46.95 |
| 40 | 46.38 | 43.85 | 46.37 |
| 45 | 45.67 | 45.02 | 45.67 |
| 50 | 44.84 | 45.26 | 44.85 |
| ... | ... | ... | ... |
| ... | ... | ... | ... |
| 350 | 48.60 | 46.33 | 48.58 |
| 355 | 48.70 | 46.34 | 48.67 |
| 360 | 48.73 | 46.35 | 48.70 |

INQUIRY METHOD OF THE SOURCE WHICH GENERATES ELECTROMAGNETIC WAVE

BACKGROUND OF THE INVENTION

1. Field of the Invention

The present invention is related to a technique capable of identifying a source generating an electromagnetic wave.

2. Description of the Related Art

Conventionally, when a magnetic field near either an electronic circuit board or an electronic appliance is measured, the current flows are predicted to be at a position where the strength of this nearby magnetic field is high, and this current is a source of generating a remote electric field.

In a conventional prediction method, the probability exists that such a current will be detected, and that this current is not a source for generating a remote electric field.

For instance, when two current elements (remote electric-field-generating sources) having two phases opposite to each other are present on an object to be measured, an interval "d" between these two current elements is longer than a distance "1" defined from the object to be measured to a measurement point of the nearby magnetic field. The interval is also sufficiently smaller than a wavelength "λ" thereof. Electric fields generated from both current elements may cancel one another, and thus, these electric fields may not constitute a major factor of a remote electric field. However, in the prediction method of the related art, these currents may be perceived as the source for generating the remote electric field Similarly, even when currents having opposite phases to each other do not appear, that is, when electric fields radiated to the space have opposite phases to each other in view of the relationship of the intervals of current sources, the currents may be identified as the source generating the remote electric field.

But in the conventional prediction method as used to make the prediction described above, the following problems occur. Since the value of the electric field strength at the remote location is indefinite, the conventional prediction method cannot determine whether this value actually exceeds the controlled value. Even when a measurement is taken of the current flow at the position where the strength of the nearby magnetic field is high, the conventional prediction method cannot determine whether the electric field strength at the remote location is increased, or decreased.

In other words, the conventional prediction method cannot provide a clear definition. That is, in the current distribution over either the electronic circuit board or the electronic appliance, which is the object to be measured, the conventional prediction method cannot clarify what current flowing through which point may constitute the major factor for generating a remote electric field.

Moreover, the conventional prediction method cannot provide a clear definition of how the remote electric field is changed by a variation in the currents flowing at an arbitrary point.

BRIEF SUMMARY OF THE INVENTION

An object of the present invention is to solve these problems, and, accordingly, to provide an electromagnetic-wave-generating-source search method capable of easily determining the source generating a remote electric field, so that the appropriate current/currents may be measured.

To achieve this object, an electromagnetic-wave-generating-source search method, according to an aspect of the present invention, calculates a contributing rate which constitutes a remote electric field of each of the current sources (namely, magnetic-field-generating sources) having an investigation object, and then, the calculated contributing rate is displayed. Specifically, all the remote electric fields caused by all the currents flowing over either an electronic circuit board or an electronic appliance are measured, or calculated. Then, the difference between the remote electric field and an electric field caused by each of the currents is calculated. Thus, another calculation is made of a contributing rate of a current which generates a remote electric field at this point.

In addition, an electronic-wave-generating-source search method according to a further aspect of the present invention is provided. In this embodiment, because the current distribution is multiplied by a coefficient to obtain a remote electric field, it is possible to predict a change in remote electric fields when a current flowing over either the electronic circuit board or the electronic appliance changes.

As a result, this electromagnetic-wave-generating-source search method can clarify whether a current flowing at a certain point constitutes a factor for generating a remote electric field within the current distribution over either the electronic circuit board or the electronic appliance . This electromagnetic-wave-generating-source search method can also clarify how the remote electric field changes in response to changes in the currents flowing at the arbitrary point. Accordingly, this electrornagnetic-wave-generating-source search method can readily identify the electric-field-generating source that should be measured.

BRIEF DESCRIPTION OF THE DRAWINGS

For a better understanding of the present invention, reference is made to the detailed description to be read in conjunction with the accompanying drawings, in which:

FIG. 7 shows an exemplary data format of a magnetic field measurement result;

FIG. 8 shows an exemplary data format of a current-distribution search result;

FIG. 9 shows an exemplary data format of an electric field calculation result;

DETAILED DESCRIPTION OF THE INVENTION

Figure 2:
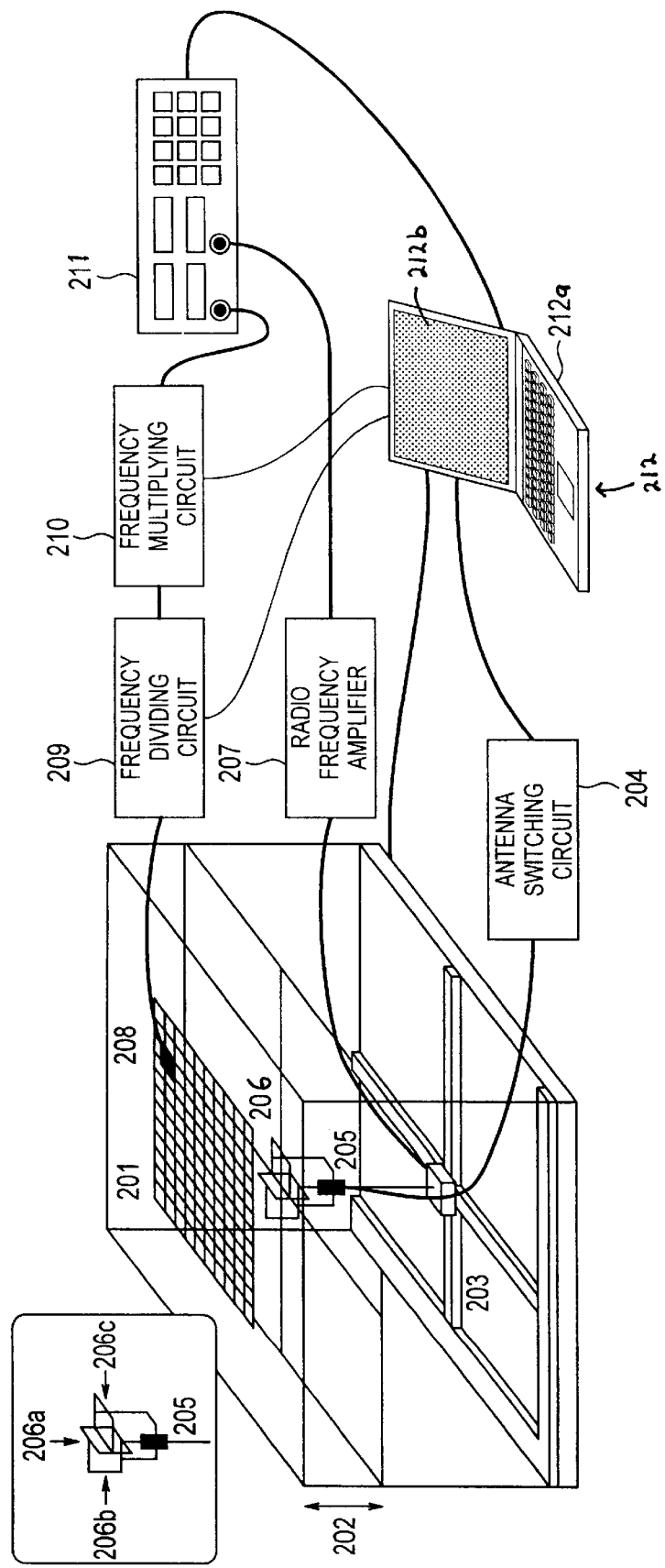
FIG. 2 is a block diagram indicating a configuration of an apparatus for searching for a spurious electromagnetic-wave-generating source.

FIG. 2 is a block diagram of a configuration of an apparatus for measuring the magnetic field distribution of an object to be measured, in order to calculate current distribution in this object based upon measurement results of the magnetic field distribution. The apparatus is also used to calculate a remote-electric-field distributing rate, with respect to the current distribution, by employing the current-distribution calculation result.

With regard to configuration of such a measuring apparatus, because the adverse effect of a mirror image is caused by a direct-search-type measuring apparatus, the main body of the direct-search-type measuring apparatus of the present invention is separated from the object to be measured to reduce this adverse effect. Then, a small-sized magnetic probe is extended from the main body of the measuring apparatus to the object to be measured in order to carry out direct-search measurement. This small-sized magnetic field probe does not substantially disturb the magnetic probe.

The apparatus for searching for a spurious electromagnetic-wave-generating source shown in this drawing is provided with a three-dimensional magnetic field probe 206, an antenna switching-switch 205, an antenna-switching circuit 204, a radio frequency (high frequency) amplifier 207, a probe 208, a frequency dividing circuit 209, a frequency multiplying circuit 210, a vector voltage meter 211, a computer 212, a storage apparatus 212a, and a display apparatus 212b.

Three dimensional magnetic field probe 206 is formed by employing a probe 206=afor detecting an x-directional magnetic field, a probe 206b for detecting a y-directional magnetic field, and a probe 206c for detecting a z-directional magnetic field in an integral form to detect a magnetic field of an object 201 to be measured. Both antenna-switching switch 205 and antenna-switching circuit 204 are used to selectively switch probe 206a for detecting the x-directional magnetic field, probe 206b for detecting the y-directional magnetic field, and probe 206c for detecting the z-directional magnetic field. Radio frequency amplifier 207 amplifies a detection signal derived from three dimensional magnetic field probe 206. Probe 208 is used to extract a reference clock signal in order to acquire a phase of a magnetic field. Both frequency dividing circuit 209 and frequency multiplying circuit 210 are employed to convert a frequency of the reference clock signal into a desirable frequency of a reference clock signal. Vector voltage meter 211 is used to measure a voltage which is induced by a magnetic field interlinking magnetic probe 206, while containing a phase shift of the induced voltage with respect to the reference clock signal. Computer 212 is equipped with a CPU, a memory, and the like. Storage apparatus 212a stores a program and the like, which are used to calculate a remote electric field distributing rate. Display apparatus 212b is used to display a calculation output result and the like. It should be noted that storage apparatus 212a may be realized by, for instance, a storage medium for storing a program and data, and by a storage medium reading apparatus for reading the program and data.

In this apparatus for searching for a spurious electromagnetic-wave-generating source, at a point of a distance 202 which is electromagnetically located near the object to be. measured 201, a magnetic field generated from object 201 is measured by three-dimensional magnetic probe 206 which is formed by combining the x-directional magnetic field probe 206a, the y-directional magnetic field probe 206b, and the z-directional magnetic field probe 206c with each other. The three dimensional magnetic probe 206 is constructed of, for example, three sets of loop antennas 206a, 206b, and 206c. In this case, a distance which is electromagnetically located near object 201 indicates the numeric range of a distance "r" which may satisfy a condition of $(2\pi/\lambda)<1$.

The voltages induced by the nearby magnetic field, which is detected by three-dimensional magnetic field probe 206, are amplified by radio frequency amplifier 207 with respect to each of the x-, y-, z-directional components, and then, the amplified voltages are supplied to vector voltage meter 211. On the other hand, an operation clock of the object to measured 201 is detected by probe 208, and the detected operation clock is frequency-divided by frequency dividing circuit 209 to extract a desirable frequency component, if necessary. The frequency-divided operation clock is frequency-multiplied by frequency multiplying circuit 210, and thereafter, the frequency-multiplied operation clock is applied as a phase reference to vector voltage meter 211.

Vector voltage meter 211 receives the magnetic field measurement signals detected by three-dimensional magnetic field probe 206, as well as the operation clock signal derived from frequency-multiplying circuit 210, then extracts information regarding the magnitude of each of the measured magnetic fields and information about a phase of each of the measured magnetic fields, with respect to each component of the respective directions.

The signals indicative of the magnitudes and the phases of the measured nearby magnetic field are read by computer 212, which is employed to execute both the control of the measuring operation and the calculation of the measuring operation.

Computer 212 also supplies a signal to a stage 203 in order to determine the position of three dimensional probe 206, and to select the respective directional components of the magnetic field probe via the antenna switching circuit. Computer 212 separately controls frequency dividing circuit 209 and frequency multiplying circuit 210 to convert the frequency of the reference clock of object 201 into a desirable frequency, and also controls vector voltage meter 211 to read the measurement data. As a result, computer 212 is capable of measuring a nearby three-dimensional magnetic field with respect to a radio frequency (high frequency) component of the operation clock of object 201 by storing the above-explained various information regarding the measured magnitudes and phases of the nearby magnetic field.

Furthermore, while the three-dimensional magnetic field measurement value obtained in the above described manner is employed, computer 212 count-calculates a current distribution functioning as an electromagnetic-wave-generating source with respect to object 201 based upon a calculation method (explained in detail later). Then, computer 212 calculates a remote electric field distribution and a remote electric field contributing rate based upon the calculated current distribution, and outputs the calculation results to the display apparatus 212b. It should also be noted that although the reference clock extracting probe 208, frequency dividing circuit 209, and frequency multiplying circuit 210 are employed to derive the operation clock frequency of object 201 and to convert this clock frequency into a desirable frequency, these circuits are not always required. An alternative arrangement may be employed which uses, for example, a signal generator and the like, capable of scanning a frequency range to be measured.

Figure 3:
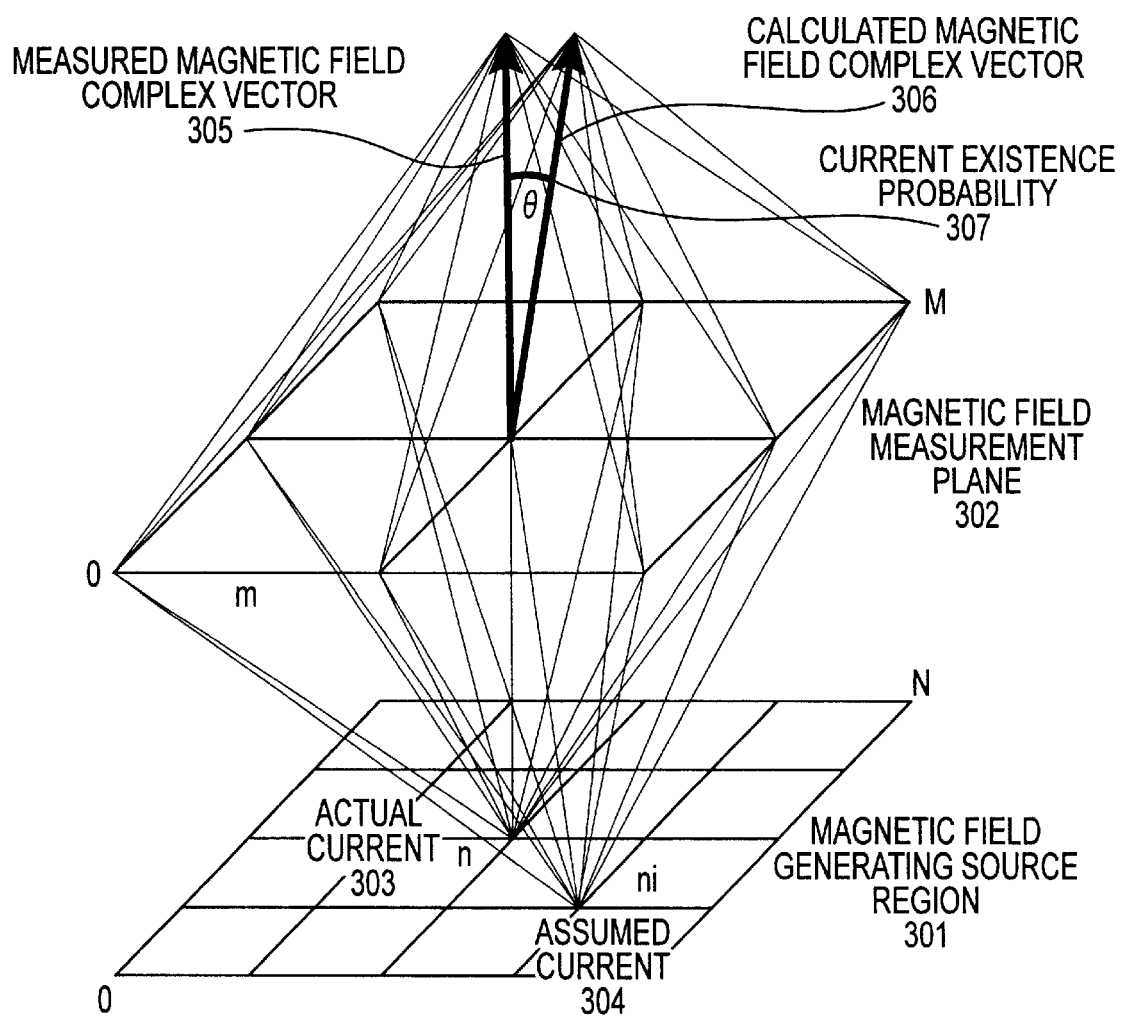
FIG. 3 is a conceptual diagram for explaining a search method of a superior electromagnetic-wave-generating source.
Figure 4:
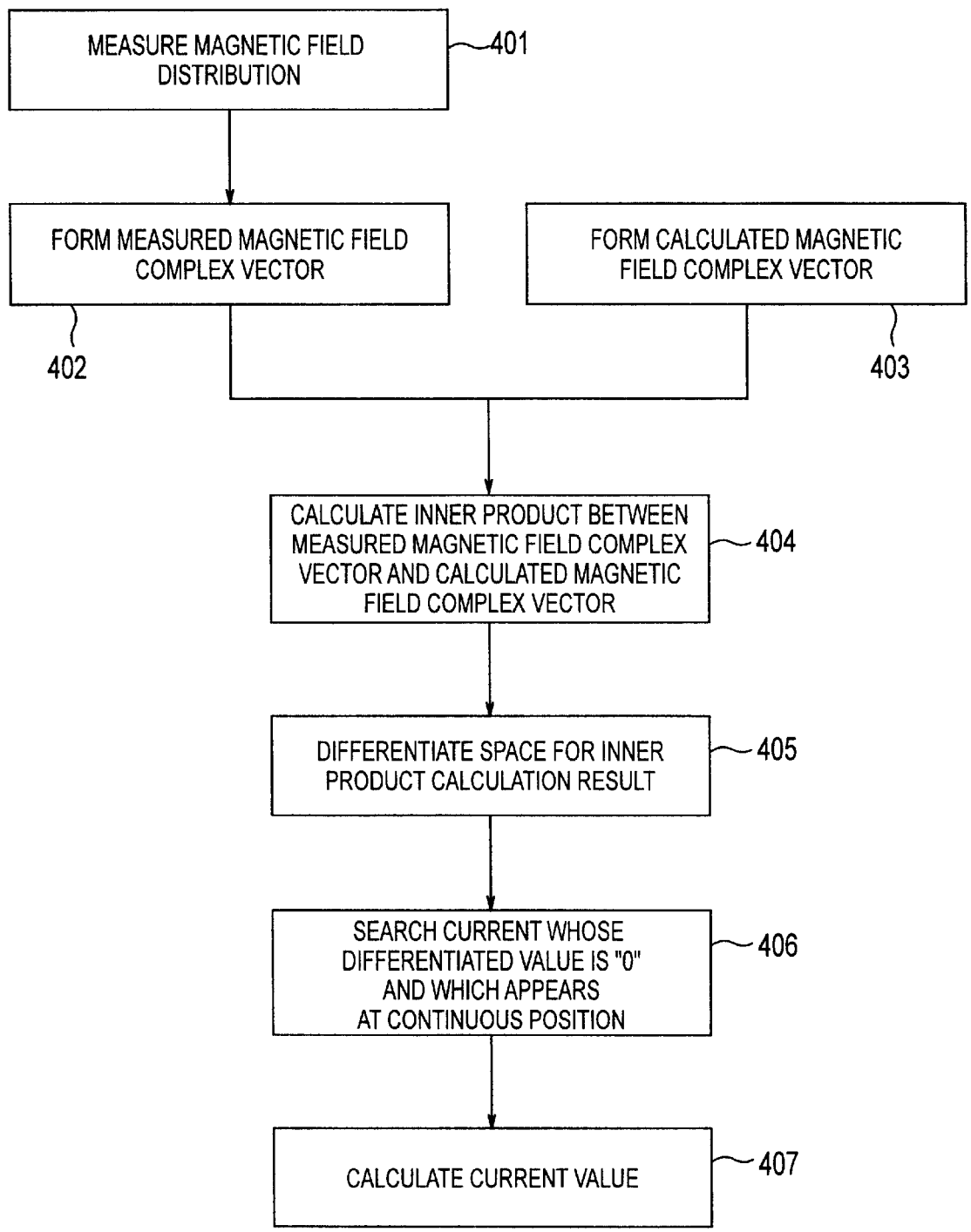
FIG. 4 is a flowchart describing a search operation of a superior electromagnetic-wave-generating-source.

Referring now to FIG. 3 and FIG. 4, an example of a count-calculation process. operation (search process operation) is described whereby a current distribution corresponding to an electromagnetic wave generating source may be count-calculated based on a magnetic field measurement value. This search process operation is described in greater detail in JP-A-11-142453 by the Applicant. This search process operation corresponds to a method capable of calculating current elements and an entire current distribution, by executing a pattern-matching operation between a magnetic field distribution generated from an assumed current element and a measured magnetic field distribution.

FIG. 3 shows a conceptual diagram of an analysis, and FIG. 4 is a flowchart of the overall process operation of this search process operation. It should be understood that this search operation may be realized in a manner such that a program for searching for a spurious electromagnetic-wave-generating source is executed by the CPU of the computer 212, and this search program is stored in advance in storage apparatus 212a of the apparatus for searching for a spurious electromagnetic-wave-generating source, as shown in FIG. 2.

In this search operation, first of all, measurement of a nearby magnetic field is carried out at each of "M" pieces of grid points "m" on a two-dimensional measurement plane 302 which is subdivided as indicated in FIG. 3 (step 401). In this example, while a circuit board and the like on which various electronic devices are mounted is understood to be measuring object 201, it is assumed that all the magnetic field generating sources are located on a two-dimensional plane, namely, magnetic field generating source region 301, positioned in parallel to an x-y plane. The measurement result is stored either in the memory of computer 212 or in storage apparatus 212a. FIG. 7 is an example of a data file to be stored in memory or in storage apparatus 212a.

Next, the data of the measured nearby magnetic field is read from either the memory of computer 212 or storage apparatus 212a. Computer 212 calculates a current component in the x-direction, a current component in the y-direction, and a current component in the z-direction, along which the measured nearby magnetic field is thought to be generated. In the beginning, in this search operation, a y-directional component of the measured nearby magnetic field is acquired in order to obtain the current component along the x-direction. In this case, when a current which should be acquired as the actual electromagnetic-wave-generating source is present on a grid point 303 shown in FIG. 3, distribution of a y-directional component of the nearby magnetic field measurement value on measurement plane 302, which is measured by three-dimensional magnetic probe 206, has a dimension equal to a total number of grid points where the nearby magnetic field measurement is carried out. This distribution of the y-directional component also may be expressed as the following complex vector 305. In this complex vector 305, a measurement value obtained at each of the grid points is used as a value of the respective dimensions.

This complex vector will be referred to hereafter as a "measured magnetic field synthesized complex vector 305". In step 402 of FIG. 4, this measured magnetic field synthesized complex vector 305 is set based on the measurement data.

In contrast to that, at a step 403, a calculated magnetic field synthesized complex vector 306 is obtained. This calculated magnetic field synthesized complex vector 306 may be obtained when the x-directional current is assumed to be at one grid point 304 on magnetic field generating source region 301. A distribution of a y-directional component of a nearby magnetic field calculation value, which is produced on measurement plane 302 by this assumed current, has a dimension equal to the total number of grid points where the nearby magnetic field measurement is carried out. This distribution of the y-directional component may be expressed as complex vector 306. In complex vector 306, a calculation value at each of the grid points is used as a value of each of the dimensions. A current existence probability distribution at grid point 304 on the electromagnetic-wave-generating-source region 301 may be obtained by acquiring current existence probability $\cos\theta$ 307. This current existence probability $\cos\theta$ is obtained by an inner product of the two complex vectors 305 and 306. In accordance with this embodiment mode, while using the same method—explained above, assuming that the currents exist in accordance with the respective grid points, are set by subdividing electromagnetic-wave-generating-source region 301, calculated magnetic field synthesized complex vector 306 may be obtained.

Next, the inner product value of the measured magnetic field synthesized complex vector 305 obtained at step 402 and the calculated magnetic field synthesized complex vector 306 obtained at step 403 is calculated for every current assumed at each of the grid points of electromagnetic-wave-generating-source region 301 (step 404). This is accomplished by employing, for example, formulas 1 and 2, as follows.

$$\text{Formula 1} = \begin{cases} Hx_x(m,n) \cdot Ix(n) = 0 \\ Hx_y(m,n) \cdot Iy(n) = \dfrac{Iy(n) \cdot dy}{4\pi r_{mn}}\left(jk + \dfrac{1}{r_{mn}}\right)\cos\theta \cdot e^{jkr_{mn}} = \dfrac{Iy(n) \cdot dy}{4\pi r_{mn}}\left(jk + \dfrac{1}{r_{mn}}\right)\dfrac{z_p - z_x}{r_{mn}} \cdot e^{jkr_{mn}} \\ Hx_z(m,n) \cdot Iz(n) = \dfrac{Iz(n) \cdot dz}{4\pi r_{mn}}\left(jk + \dfrac{1}{r_{mn}}\right)\sin\theta \cdot \sin\phi \cdot e^{-jkr_{mn}} = -\dfrac{Iz(n) \cdot dz}{4\pi r_{mn}}\left(jk + \dfrac{1}{r_{mn}}\right)\dfrac{y_p - y_s}{r_{mn}} \cdot e^{-jkr_{mn}} \\ Hy_x(m,n) \cdot Ix(n) = \dfrac{Ix(n) \cdot dx}{4\pi r_{mn}}\left(jk + \dfrac{1}{r_{mn}}\right)\cos\theta \cdot e^{jkr_{mn}} = -\dfrac{Ix(n) \cdot dx}{4\pi r_{mn}}\left(jk + \dfrac{1}{r_{mn}}\right)\dfrac{z_p - z_x}{r_{mn}} \cdot e^{jkr_{mn}} \\ Hy_y(m,n) \cdot Iy(n) = 0 \\ Hy_z(m,n) \cdot Iz(n) = \dfrac{Iz(n) \cdot dz}{4\pi r_{mn}}\left(jk + \dfrac{1}{r_{mn}}\right)\sin\theta \cdot \cos\phi \cdot e^{jkr_{mn}} = -\dfrac{Iz(n) \cdot dz}{4\pi r_{mn}}\left(jk + \dfrac{1}{r_{mn}}\right)\dfrac{x_p - x_x}{r_{mn}} \cdot e^{jkr_{mn}} \\ Hz_x(m,n) \cdot Ix(n) = \dfrac{Ix(n) \cdot dx}{4\pi r_{mn}}\left(jk + \dfrac{1}{r_{mn}}\right)\sin\theta \cdot \sin\phi \cdot e^{-jkr_{mn}} = \dfrac{Ix(n) \cdot dx}{4\pi r_{mn}}\left(jk + \dfrac{1}{r_{mn}}\right)\dfrac{y_p - y_s}{r_{mn}} \cdot e^{-jkr_{mn}} \\ Hz_y(m,n) \cdot Iy(n) = \dfrac{Iy(n) \cdot dy}{4\pi r_{mn}}\left(jk + \dfrac{1}{r_{mn}}\right)\sin\theta \cdot \cos\phi \cdot e^{jkr_{mn}} = -\dfrac{Iy(n) \cdot dy}{4\pi r_{mn}}\left(jk + \dfrac{1}{r_{mn}}\right)\dfrac{x_p - x_x}{r_{mn}} \cdot e^{jkr_{mn}} \\ Hz_z(m,n) \cdot Iz(n) = 0 \end{cases}$$

$$\text{Formula 2} = \begin{cases} \displaystyle\sum_{m1}^{M} Hm_y(m) \cdot Hy_x(m,n') \cdot \sum_{m1}^{M} Hm_x(m) \cdot Hz_x(m) \cdot (m,n') = \\ \displaystyle\sum_{m1}^{M}\sum_{n1}^{N} \{Hy_x(m,n) \cdot Ix(n) \cdot Hy_z(m,n') \cdot Hz_x(m,n) \cdot Ix(n) \cdot Hz_x(m,n')\} \\ \displaystyle\sum_{m1}^{M} Hm_x(m) \cdot Hx_y(m,n') \cdot \sum_{m1}^{M} Hm_z(m) \cdot Hz_y(m,n') = \\ \displaystyle\sum_{m1}^{M}\sum_{n1}^{N} \{Hx_y(m,n) \cdot Iy(n) \cdot Hx_y(m,n') \cdot Hz_y(m,n) \cdot Iy(n) \cdot Hz_y(m,n')\} \\ \displaystyle\sum_{m=1}^{M} Hm_x(m) \cdot Hx_z(m,n') \cdot \sum_{m=1}^{M} Hm_y(m) \cdot Hy_z(m,n') = \\ \displaystyle\sum_{m=1}^{M}\sum_{n=1}^{N} \{Hx_z(m,n) \cdot Iz(n) \cdot Hx_z(m,n') \cdot Hy_z(m,n) \cdot Iz(n) \cdot Hy_z(m,n')\} \end{cases}$$

The inner product value obtained in this case may be expressed by the ratio obtained by dividing the squared z-directional distance between magnetic field generating source region 3011 and measurement plane 302 by a summed value. The summed value is calculated by adding the squared z-directional distance to a squared distance between a grid point at which a current to be searched is present (for example, grid point 303) and another grid point at which the assumed current is present (for example, grid point 304). When the position of the assumed current is made coincident with the position of the existence current, the calculated inner product value becomes a maximum value. When the position of the assumed current is made substantially equal to the position of the existence current, the calculated inner product value becomes a local maximum value.

In accordance with this embodiment mode, in order to obtain either the maximum value of this inner product value or the local maximum value of this inner product value, the calculated inner product value is differentiated with respect to the space of the electromagnetic-wave-generating-source region 301 (step 405), and then, a position at which the differentiated value is equal to 0 and also is continuous is determined as a position of the actual electromagnetic-wave-generating source (step 406).

Furthermore, both a magnitude of a current and a phase of this current functioning as the electromagnetic wave generating source existing at this position may be obtained as follows. That is, since the squared cosine is equal to 1 in the inner product value between measured magnetic field synthesized complex vector 305 and calculated magnetic field synthesized complex vector 306, the inner product value of both these vectors is divided by the magnitude of calculated magnetic field synthesized complex vector 306, so that both the magnitude of the current and the phase thereof may be obtained (step 407).

With execution of the operation described above, as regards the x-direction current component corresponding to the y-direction current component of the nearby magnetic field measurement value, the information related to the magnitude thereof, the phase thereof, and the position thereof may be acquired. It should also be noted that since a similar operation is carried out when a nearby magnetic field of an x-direction component is measured to obtain a current component of the y-direction, explanations thereof are omitted.

As described above, the current distribution may be calculated from the measured magnetic field distribution. This calculated result is stored in the memory of computer 212. FIG. 8 shows an example of a data file which is stored in this memory.

It should also be understood any types of methods may be employed for calculating this current distribution, if these alternative methods calculate how much current flows at each of the grid points. Alternatively, when such a current distribution is calculated, the measured electric field distribution may be used instead of the magnetic field distribution. However, when measurement sensitivity and the like are considered, a method for measuring the magnetic field distribution may be preferable.

Figure 1:
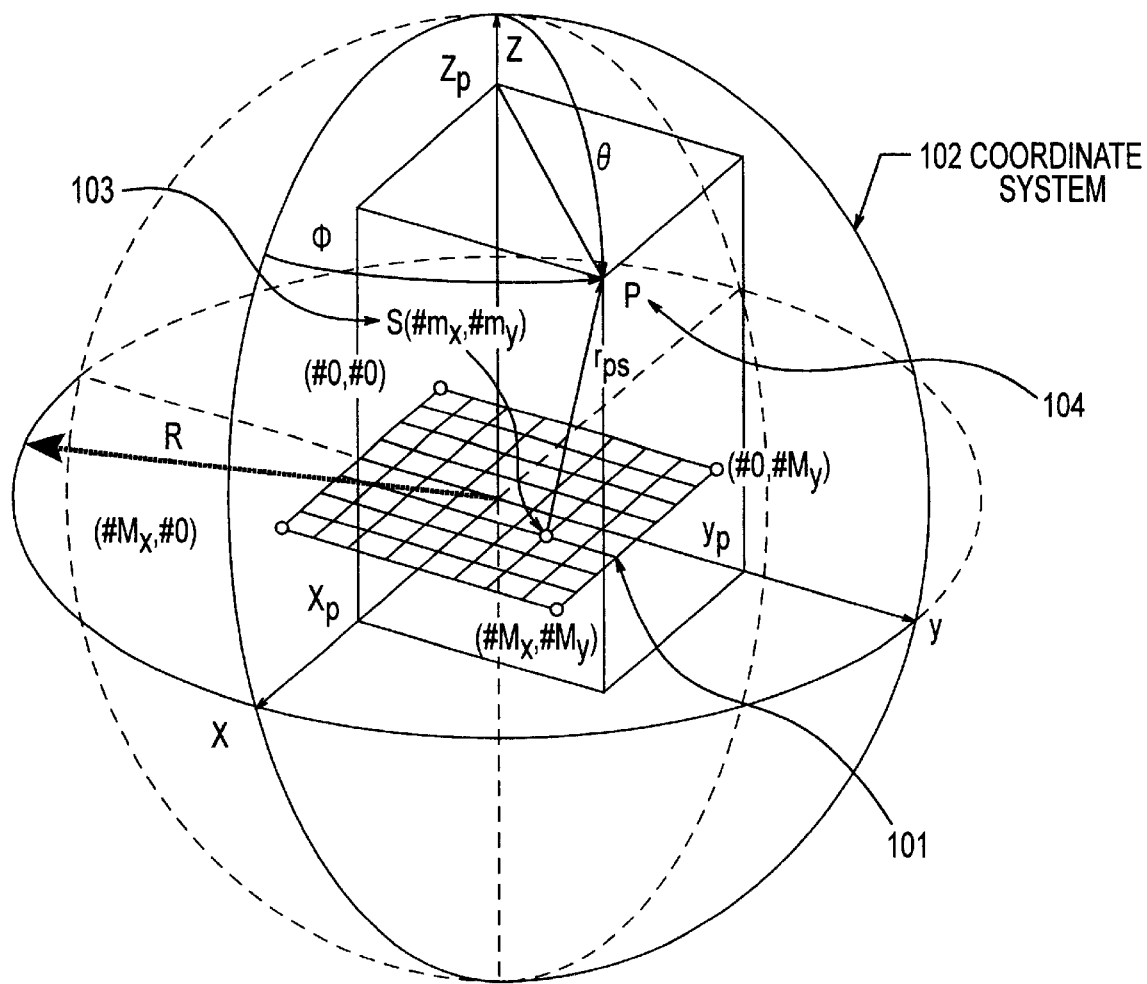
FIG. 1 is a schematic drawing showing a coordinate system used to acquire, for measurement, both the current distributions and remote electric fields of either an electronic circuit board or an electronic appliance.

While the current distribution corresponding to these calculation results is employed, a remote electric field distributing rate related to this current distribution is calculated. An example of this occurrence follows. FIG. 1 is a conceptual diagram of the calculation of the remote electric field distributing rate, and represents a case where either an electronic circuit board or an electronic appliance 101, which is the object to be measured, is present on the plane. In FIG. 1, assuming now that lengths of the respective edges of either the electronic circuit board or the electronic appliance 101 are "Lx" and "Ly", the respective edges are subdivided into "Nx" and "Ny" in such a manner that it becomes a mesh shape made of lengths "dx" and "dy." Each of cross points "S" (#nx, #ny):103 subdivided as this mesh shape corresponds to the grid point "n" indicated in FIG. 3, and a current value of this cross point "S" is expressed by I (xs, ys). In addition, either the electronic circuit board or electronic appliance 101, which is the object of measurement, is located on coordinate system 102 in such a manner that a center point of either this electronic circuit board or electronic appliance 101 constitutes an origin of coordinate system 102.

Figure 5:
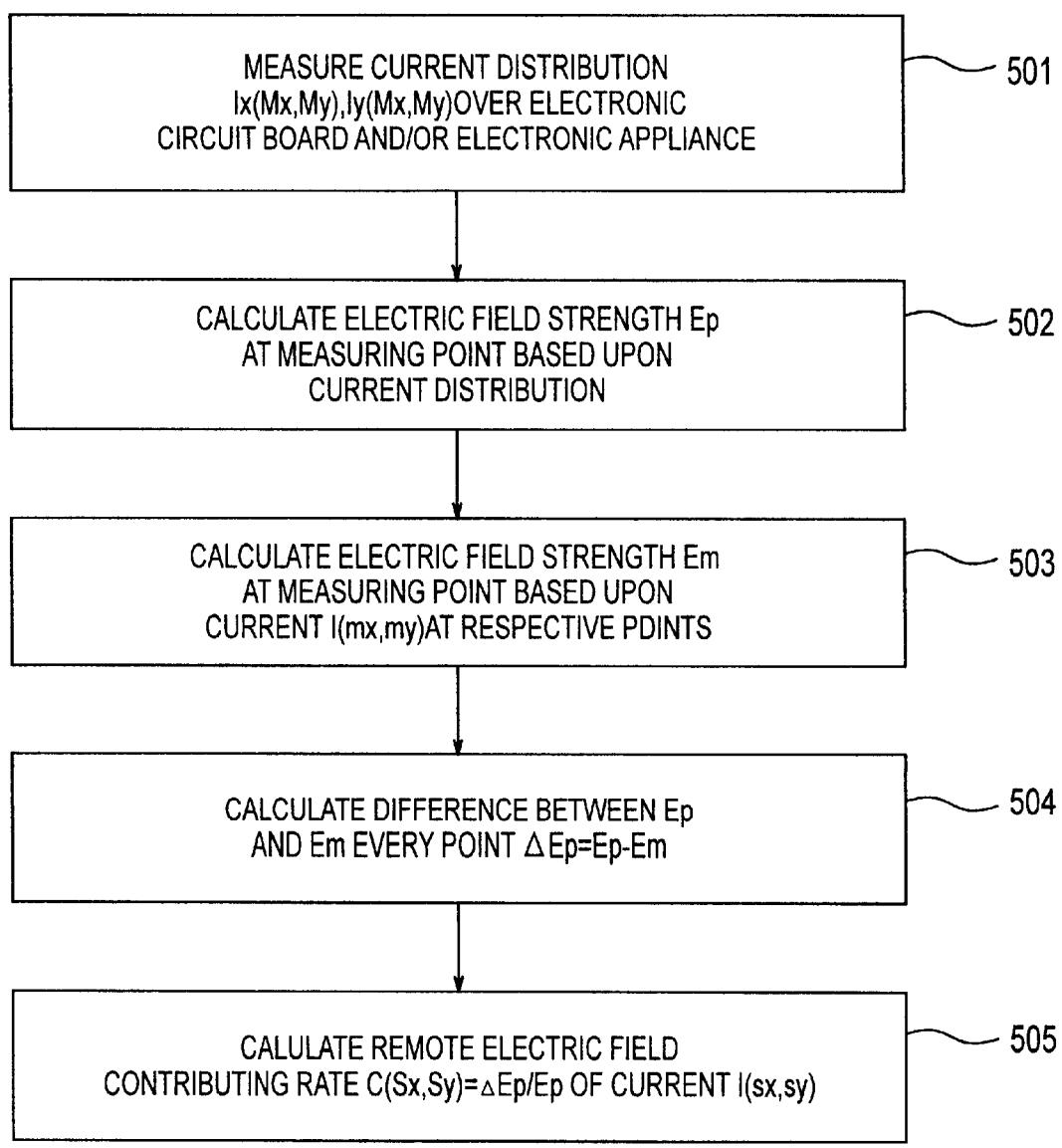
FIG. 5 is a flowchart explaining calculation of a remote-electric-field-generation contributing rate.

FIG. 5 is a flowchart describing a method of calculating a remote electric field contributing rate related to a current distribution which constitutes the object to be measured.

This process may be initiated by the CPU of computer 212 executing a contributing rate calculation program previously stored in storage apparatus 212a of the spurious electromagnetic-wave-generating-source search apparatus shown in FIG. 2.

While the foregoing method and the like are employed, at step 501, when a current distribution is measured in the object of measurement, either the electronic circuit board or the electronic appliance 101, a calculation is made of electric field strength "Ep" at a measuring point P:104 based upon the calculated current distribution (step 502). In this case, assuming that the distance between an existence position S:103 of a current element and an electric field measuring point P (xp, yp, zp):104 is equal to "Rps", an electric field strength "E" at measuring point P may be obtained as shown in formula 3. The field strength[?] is caused by a current at position 5:103 on the object of measurement(either electronic circuit board or electronic appliance 101). The existence position S:103 of the current element is located on either electronic circuit board or electronic appliance 101, whereas the electric field measuring point P (xp, yp, zp):104 is present on a spherical plane at a desirable distance "R" from the object of measurement, (electronic circuit board or electronic appliance 101).

Formula 3

$$\begin{cases} \Delta E_x\{I_x(x_s, y_s)\} = \dfrac{\eta \cdot I_x(x_s, y_s) \cdot d_x}{4\pi r_{ps}} \left\{ 2\left(\dfrac{1}{r_{ps}} + \dfrac{1}{jkr_{ps}^2}\right)\dfrac{(x_p - x_s)^2}{r_{ps}^2} - \right. \\ \left.\left(jk + \dfrac{1}{r_{ps}} + \dfrac{1}{jkr_{ps}^2}\right)\dfrac{(y_p - y_s)^2 + z_p^2}{r_{ps}^2}\right\} \cdot e^{jkr_{ps}} \\ \Delta E_y\{I_x(x_s, y_s)\} = \dfrac{\eta \cdot I_x(x_s, y_s) \cdot d_x}{4\pi r_{ps}}\left(jk + \dfrac{3}{r_{ps}} + \dfrac{3}{jkr_{ps}^2}\right) \cdot \\ \dfrac{x_p - x_s}{r_{ps}} \cdot \dfrac{y_p - y_s}{r_{ps}} \cdot e^{jkr_{ps}} \\ \Delta E_z\{I_x(x_s, y_s)\} = \dfrac{\eta \cdot I_x(x_s, y_s) \cdot d_x}{4\pi r_{ps}}\left(jk + \dfrac{3}{r_{ps}} + \dfrac{3}{jkr_{ps}^2}\right) \cdot \\ \dfrac{x_p - x_s}{r_{ps}} \cdot \dfrac{z_p}{r_{ps}} \cdot e^{jkr_{ps}} \end{cases}$$

$$\begin{cases} \Delta E_x\{I_y(x_s, y_s)\} = \dfrac{\eta \cdot I_y(x_s, y_s) \cdot d_y}{4\pi r_{ps}}\left(jk + \dfrac{3}{r_{ps}} + \dfrac{3}{jkr_{ps}^2}\right) \cdot \\ \dfrac{x_p - x_s}{r_{ps}} \cdot \dfrac{y_p - y_s}{r_{ps}} \cdot e^{jkr_{ps}} \\ \Delta E_y\{I_y(x_s, y_s)\} = \dfrac{\eta \cdot I_y(x_s, y_s) \cdot d_y}{4\pi r_{ps}} \left\{ 2\left(\dfrac{1}{r_{ps}} + \dfrac{1}{jkr_{ps}^2}\right)\dfrac{(y_p - y_s)^2}{r_{ps}^2} - \right. \\ \left.\left(jk + \dfrac{1}{r_{ps}} + \dfrac{1}{jkr_{ps}^2}\right)\dfrac{(x_p - x_s)^2 + z_p^2}{r_{ps}^2}\right\} \cdot e^{jkr_{ps}} \\ \Delta E_z\{I_y(x_s, y_s)\} = \dfrac{\eta \cdot I_y(x_s, y_s) \cdot d_y}{4\pi r_{ps}}\left(jk + \dfrac{3}{r_{ps}} + \dfrac{3}{jkr_{ps}^2}\right) \cdot \\ \dfrac{y_p - y_s}{r_{ps}} \cdot \dfrac{z_p}{r_{ps}} \cdot e^{jkr_{ps}} \end{cases}$$

Then, as shown in formula 4, since all the electric field strengths caused by all the current elements on the object of measurement (electronic circuit board or electronic appliance 101) are calculated to be added to each other, the electric field strength "Ep" produced at measuring point "P" by the object of measurement may be acquired:

$$\begin{cases} E_x = \sum_{m_x 0}^{M_x} \sum_{m_y o}^{M_y} \frac{\eta \cdot e^{-jkr_{ps}}}{4\pi r_{ps}} \Bigg[ I_x(x_s, y_s) \cdot d_x \cdot \left\{ 2\left(\frac{1}{r_{ps}} + \frac{1}{jkr_{ps}^2}\right) \frac{(x_p - x_s)^2}{r_{ps}^2} - \right. \\ \left. \left(jk + \frac{1}{r_{ps}} + \frac{1}{jkr_{ps}^2}\right) \frac{(y_p - y_s)^2 + z_p^2}{r_{ps}^2} \right\} + I_y(x_s, y_s) \cdot d_y \cdot \left(jk + \frac{3}{r_{ps}} + \frac{3}{jkr_{ps}^2}\right) \cdot \\ \frac{(x_p - x_s)(y_p - y_s)}{r_{ps}^2} \Bigg] \\ E_y = \sum_{m_x 0}^{M_x} \sum_{m_y o}^{M_y} \frac{\eta \cdot e^{-jkr_{ps}}}{4\pi r_{ps}} \Bigg[ I_s(x_s, y_s) \cdot d_x \cdot \left(jk + \frac{3}{r_{ps}} + \frac{3}{jkr_{ps}^2}\right) \cdot \\ \frac{(x_p - x_s)(y_p - y_s)}{r_{ps}^2} + I_y(x_s, y_s) \cdot d_y \cdot \left\{ 2\left(\frac{1}{r_{ps}} + \frac{1}{jkr_{ps}^2}\right) \frac{(y_p - y_s)^2}{r_{ps}^2} - \right. \\ \left. \left(jk + \frac{1}{r_{ps}} + \frac{1}{jkr_{ps}^2}\right) \frac{(x_p - x_s)^2 + z_p^2}{r_{ps}^2} \right\} \Bigg] \\ E_z = \sum_{m_x=0}^{M_x} \sum_{m_y=o}^{M_y} \frac{\eta \cdot e^{-jkr_{ps}}}{4\pi r_{ps}} \Bigg[ I_x(x_s, y_s) \cdot d_x \cdot \left(jk + \frac{3}{r_{ps}} + \frac{3}{jkr_{ps}^2}\right) \cdot \frac{(x_p - x_s)z_p}{r_{ps}^2} + \\ I_y(x_s, y_s) \cdot d_y \cdot \left(jk + \frac{3}{r_{ps}} + \frac{3}{jkr_{ps}^2}\right) \cdot \frac{(y_p - y_s)z_p}{r_{ps}^2} \Bigg] \end{cases}$$

Formula 4

Figure 10:
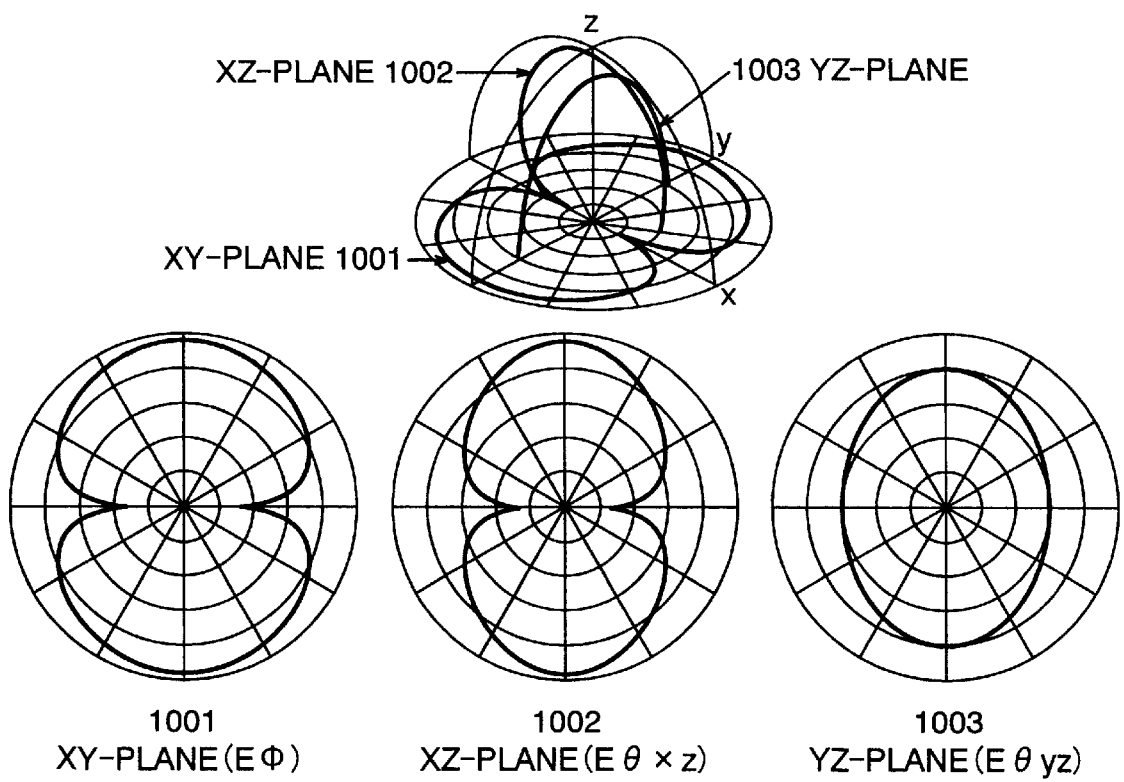
FIG. 10 illustrates an electric-field-directivity calculation result.

Furthermore, as shown in formula 5, while the position of the measuring point "P" separated by the distance "r" from the object of measurement is moved in a circumferential direction within the xy-plane, the xz-plane, or the yz-plane, the electric field strength is calculated, so that the electric field directivity of object of measurement (the electronic circuit board or the electronic appliance 101) may be obtained. In this formula 5, σ indicates an angle defined by a straight line for connecting an origin and measuring point "P" with respect to the Z axis, and "ø" denotes an angle defined by such a straight line with respect to the X axis. This straight line is obtained by projecting a straight line connecting the origin and the measuring point "P" onto the XY-plane. The calculation result is stored in either the memory of computer 212 or in storage apparatus 212*a*. FIG. 9 is an example of a data file stored in memory, or in storage apparatus 212*a*. FIG. 10 shows a display example of this calculation result, namely, the electric field strengths in an XY-plane 1001, a YZ-plane 1002, and an XZ-plane 1003.

$$r_{ps} = \sqrt{(x_{p-x_s})^2 + (y_{p-y_s})^2}$$

Formula 5

Subsequently, for example, while the positional information of measuring point "P" indicative of the maximum electric field strength is saved in association with calculated electric field strength "Ep", electric field strengths "Em" at measuring point "P", which are produced by currents I (xs, ys) of the respective cross points 5:103 having mesh shapes, are calculated in accordance with formula 3 (step 503).

Figure 11:
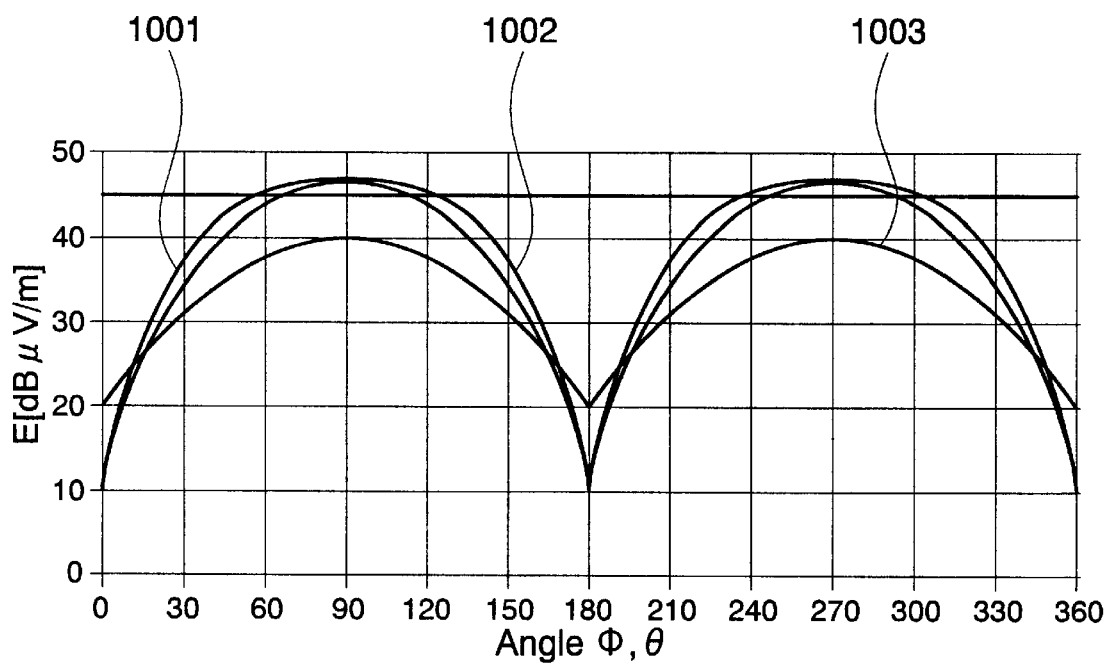
FIG. 11 illustrates detection results for electric-field-directivity peak values/regulated values exceeding a given range.

Since the primary objective of the spurious electromagnetic-wave-generating-source search operation is to suppress the remote electric fields in order to satisfy laws and regulations and the like, both measuring point "P," containing the maximum electric field strength, and an area which cannot satisfy a predetermined value (see FIG. 11) are displayed. Then, measuring point "P",within this displayed area may be designated by a user, and positional information regarding designated measuring point "P" may be saved in the memory or in the storage apparatus. Alternatively, the positional information about measuring point "P," which is designated by the user, may be merely saved.

Next, a difference value "DE" between electric field strength "Ep" and electric field strength "Em" is calculated with respect to each of the cross points 5:103 (step 504). Thereafter, a contributing rate "C" for producing a remote electric field is calculated (namely, C=ΔE/Ep) every cross point S:103 based upon formula 6, and then the calculated distributing rate "C" is displayed (step 505):

$$\begin{cases} C_{E_\phi\{I_x\}}(x_s, y_s) = \frac{E_\phi - \Delta E_\phi\{I_x(x_s, y_s)\}}{E_\phi} ; C_{E_\phi\{I_y\}}(x_s, y_s) = \frac{E_\phi - \Delta E_\phi\{I_y(x_s, y_s)\}}{E_\phi} \\ C_{E_\theta\{I_x\}}(x_s, y_s) = \frac{E_\theta - \Delta E_\theta\{I_x(x_s, y_s)\}}{E_\theta} ; C_{E_\theta\{I_y\}}(x_s, y_s) = \frac{E_\theta - \Delta E_\theta\{I_y(x_s, y_s)\}}{E_\theta} \end{cases}$$

Formula 6

Figure 12:
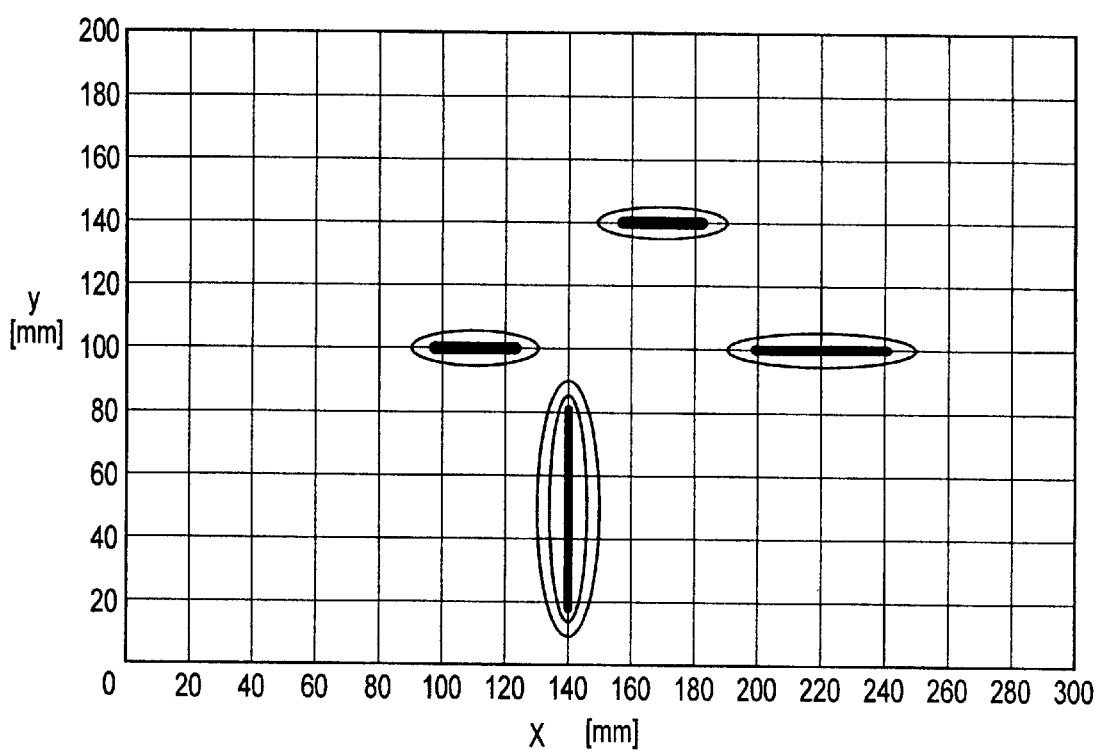
FIG. 12 illustrates an exemplary distribution of an electric-field-generation contributing rate.

FIG. 12 shows an example of this contributing rate, which is caused by a current Ix in the XY-plane. In actuality, a contributing rate is preferably displayed by a change in color, or by contrast, depending upon its rate. For convenience, the contributing rate shown as a contour line in this drawing. As apparent from the drawing, while a current flows along the X direction, the position of Y=100 to 120 [mm] corresponds to an area which may contribute to the generation of the maximum electric field, namely the area which should be considered in view of the spurious electromagnetic-wave-generating source. In addition to this example, there are a contributing rate caused by an Iy component in the XY-plane; a contributing rate caused by an Iy component in the YZ-plane; a contributing rate caused by an Iz component in the YZ-plane; a contributing rate caused by an Iz component in ZX-plane; and also a contributing rate caused by an Lx component in the ZX-plane.

With execution of the foregoing process, it is possible to represent the contributing ratio as a major reason that the current flowing at position "S" over the object of measurement, either the electronic circuit board or the electronic appliance, may produce the maximum value of the directivity at desirable distance "R." It is also possible to determine the position where the current component is present, and this current may have the greatest influence on designated measuring point "P." In this case, when the contributing rate increases, there is a great probability that the current at the position where the contributing rate increases may cause the remote electric field at measuring point P to be generated. As a result, the user can take any proper measure regarding the position where the contributing rate is great, based on this representation.

In this case, since the contributing rate overlaps the actual circuit pattern in the example, another effect of the portion where measurement should be actually taken is clearly indicated. It should also be understood that since there are various methods of calculating distributing rate "C", even when the contributing rate "C" is based on the electric field strengths "Em" at the respective cross points "S", the difference "DE" between the electric field strength "Ep" and the electric field strength "Em", or the ratio of the electric field strength "Ep" to the electric field strength "Em", may be carried out to determine which cross point "S" may have the greatest influence.

Figure 6:
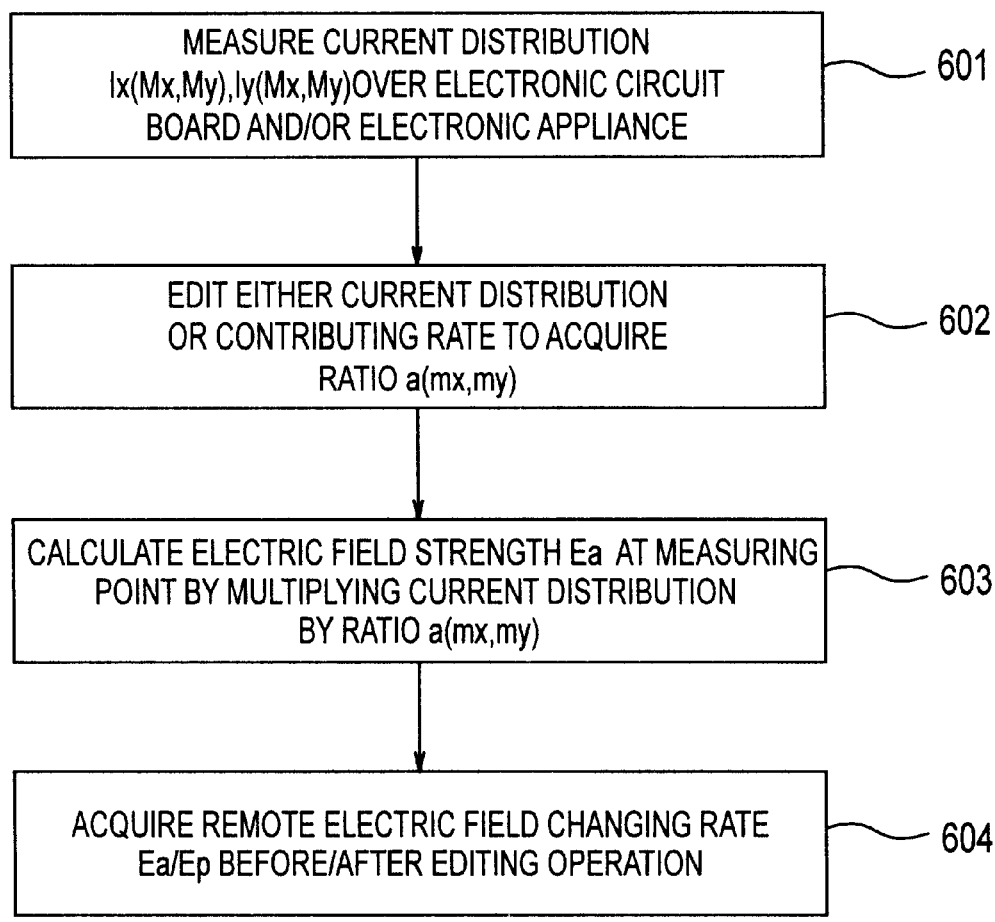
FIG. 6 is a flowchart describing calculation of a remote-electric-field changing rate.

Next, an example is presented of how the degree of an electric field suppressing effect can be achieved when a certain area is measured based on the contributing rate representation discussed above, in other words, when the current distribution over the object of measurement (the electronic circuit board or the electronic appliance) is changed based on the measurement. FIG. 6 is a flowchart explaining this process. This process may be initiated when a spurious-electromagnetic-wave-generating-source editing program previously stored in storage apparatus 212a of the spurious-electromagnetic-wave generating-source search apparatus shown in FIG. 2 is executed by the CPU of computer 212.

At step 601, a current distribution rate and a contributing rate are calculated for the object of measurement (either the electronic circuit board or the electronic appliance). As apparent from the foregoing description, the calculation results may be utilized. Next, either a current distribution (current value) or a contributing rate related to the portion where the measurement was preferably taken is edited (step 602). For example a procedure may be created which lowers either the current distribution (current value) or the contributing rate in this portion, or which can input a ratio "a" which is required[?] to be reduced. Then, the electric field strength "Ea" at measuring point "P" is calculated using the same method explained above in accordance with formula 7, based on the value obtained by multiplying either the current distribution (current value) of this portion or the contribution ratio of this portion by ratio "a" (step 603):

$$\begin{cases} E_x = \sum_{m_x 0}^{M_x} \sum_{m_y o}^{M_y} \frac{\eta \cdot e^{-jkr_{ps}}}{4\pi r_{ps}} \Bigg[ a_x(x_s, y_s) \cdot I_x(x_s, y_s) d_x \cdot \\ \left\{ 2\left(\frac{1}{r_{ps}} + \frac{1}{jkr_{ps}^2}\right) \frac{(x_p - x_s)^2}{r_{ps}^2} - \left(jk + \frac{1}{r_{ps}} + \frac{1}{jkr_{ps}^2}\right) \frac{(y_p - y_s)^2 + z_p^2}{r_{ps}^2} \right\} + \\ a_y(x_s, y_s) \cdot I_y(x_s, y_s) \cdot d_y \cdot \left(jk + \frac{3}{r_{ps}} + \frac{3}{jkr_{ps}^2}\right) \cdot \frac{(x_p - x_s)(y_p - y_s)}{r_{ps}^2} \Bigg] \\ E_y = \sum_{m_x 0}^{M_x} \sum_{m_y o}^{M_y} \frac{\eta \cdot e^{-jkr_{ps}}}{4\pi r_{ps}} \Bigg[ a_x(x_s, y_s) \cdot I_x(x_s - y_s) \cdot d_x \cdot \left(jk + \frac{3}{r_{ps}} + \frac{3}{jkr_{ps}^2}\right) \cdot \\ \frac{(x_p - x_s)(y_p - y_s)}{r_{ps}^2} + a_y(x_s, y_s) \cdot I_y(x_s, y_s) \cdot d_y \cdot \\ \left\{ 2\left(\frac{1}{r_{ps}} + \frac{1}{jkr_{ps}^2}\right) \frac{(y_p - y_s)^2}{r_{ps}^2} - \left(jk + \frac{1}{r_{ps}} + \frac{1}{jkr_{ps}^2}\right) \frac{(x_p - x_s)^2 + z_p^2}{r_{ps}^2} \right\} \Bigg] \\ E_z = \sum_{m_x=0}^{M_x} \sum_{m_y=o}^{M_y} \frac{\eta \cdot e^{-jkr_{ps}}}{4\pi r_{ps}} \Bigg[ a_x(x_s, y_s) \cdot I_x(x_s, y_s) \cdot d_x \cdot \left(jk + \frac{3}{r_{ps}} + \frac{3}{jkr_{ps}^2}\right) \cdot \\ \frac{(x_p - x_s)z_p}{r_{ps}^2} + a_y(x_s, y_s) \cdot I_y(x_s, y_s) \cdot d_y \cdot \left(jk + \frac{3}{r_{ps}} + \frac{3}{jkr_{ps}^2}\right) \cdot \frac{(y_p - y_s)z_p}{r_{ps}^2} \Bigg] \end{cases}$$

Formula 7

Then, the calculation result is compared with electric field strength "Ep" before being edited (namely, Ea/Ep is calculated), and a remote electric field changing rate before/after the editing operation is outputted (step 604).

In this embodiment mode, the procedure was created by inputting ratio "a." Alternatively, a numeric value is inputted which is capable of reducing either the current distribution (current value) or the contributing rate related to this portion, or a numeric value which is required to be reduced is entered, and the electric field strength "Ea" at measuring point "P" may be calculated based on this inputted numeric value.

As a result, since a specific portion over the surface of the object of measurement (the electronic circuit board or the electronic appliance) is measured, it is easily possible to understand how the degree of the remote electric field can be suppressed, and it is also possible to realize the effective measure. More specifically, since it is arranged so that the contributing rate is edited, such a measure capable of solving the difficulty as explained in the prior art can be easily realized. On the other hand, there is a more effective outcome when the current distribution is edited, when the result nearest to the real measurement can be obtained.

Conversely, with respect to the above-described method of calculating the contributing rate and also to the editing method, the following alternative procedure may be used. That is, while a frequency spectrum of a magnetic field is measured, the frequency spectrum of a current distribution may be calculated based upon the frequency spectrum measurement result, and an electric field strength at a measuring point may be calculated for a specific frequency or for every frequency so as to calculate a contributing rate in each of the current elements. An editing operation may be similarly carried out.

Because the contributing rate is displayed in this manner, the source generating the remote electric field which should be measured be taken can be readily determined.

What is claimed is:

1. An electromagnetic wave generating source searching method, comprising the steps of:
    (a) calculating a current distribution with use of a magnetic field strength and a phase measured from an object to be measured;
    (b) calculating a first electric field strength at a measuring point based upon said current distribution;
    (c) calculating a second electric field strength at said measuring point by employing a current distribution at a predetermined position on said measuring object, which corresponds to a part of the current distribution of said measuring object; and
    (d) calculating a relative ratio of said fist electric field strength with respect to said second electric field strength.

2. An electromagnetic wave generating source searching method as claimed in claim 1 wherein:
    in said step (d), a difference between said first electric field strength and said second electric field strength is calculated, and a ratio of said difference with respect to said first electric field strength is calculated.

3. An electromagnetic wave generating source searching method as claimed in claim 1 wherein:
    the step (a) of calculating said current distribution with use of said magnetic strength and said phase includes a step of executing an inner product between a measured magnetic field synthesized complex vector and a calculated magnetic field synthesized complex vector.

4. An electromagnetic wave generating source searching method as claimed in claims 1 wherein:
    while said measuring object is subdivided alto a mesh shaped object, said current distribution is constituted by such a fact as to whether or not a current is present at a cross point of said mesh shaped object, and also a current distribution present at a predetermined position over said measuring object is used as current information related to said cross point.

5. An electromagnetic wave generating source searching method as claimed in claim 1 wherein:
    while the magnetic distribution is measured by a frequency spectrum said current distribution is calculated based upon this measurement result of the magnetic distribution.

6. A electromagnetic wave generating source searching method as claimed in claim 5 wherein:
    a frequency characteristic of said current distribution is calculated by way of a simutation.

7. An electromagnetic wave generating source searching method as claimed in claim 1, further comprising a step of editing the current distribution to calculate a third electric field strength from the edited current distribution.

* * * * *